United States Patent
Sun et al.

(10) Patent No.: US 6,762,933 B2
(45) Date of Patent: Jul. 13, 2004

(54) METHOD AND APPARATUS FOR SELECTIVE CARD INSERTION

(75) Inventors: Cecilia Hsiao Sun, Austin, TX (US); Maria Carmen Schlesener, Pflugerville, TX (US)

(73) Assignee: Dell Products L.P., Round Rock, TX (US)

(*) Notice: Subject to any disclaimer, the term of this patent is extended or adjusted under 35 U.S.C. 154(b) by 34 days.

(21) Appl. No.: 10/152,552

(22) Filed: May 21, 2002

(65) Prior Publication Data

US 2003/0218861 A1 Nov. 27, 2003

(51) Int. Cl.$^7$ ................................................. G06F 1/16
(52) U.S. Cl. ...................... 361/684; 361/683; 361/685
(58) Field of Search ................................. 361/679–681, 361/683–686

(56) References Cited

U.S. PATENT DOCUMENTS 5,404,268 A    4/1995   O'Connor
6,525,932 B1 *  2/2003  Ohnishi et al. ............. 361/686

* cited by examiner

*Primary Examiner*—Darren Schuberg
*Assistant Examiner*—Yean-Hsi Chang
(74) *Attorney, Agent, or Firm*—Haynes and Boone, LLP

(57) ABSTRACT

A selective card insertion apparatus includes a carrier having a first card slot and a second card slot formed therein. The first card slot is separated from the second card slot. The first card slot includes a first end and a second end. A connector is provided at the second end. A stop is positioned between the first end and the connector for permitting insertion of a first card and for stopping insertion of a second card.

25 Claims, 6 Drawing Sheets

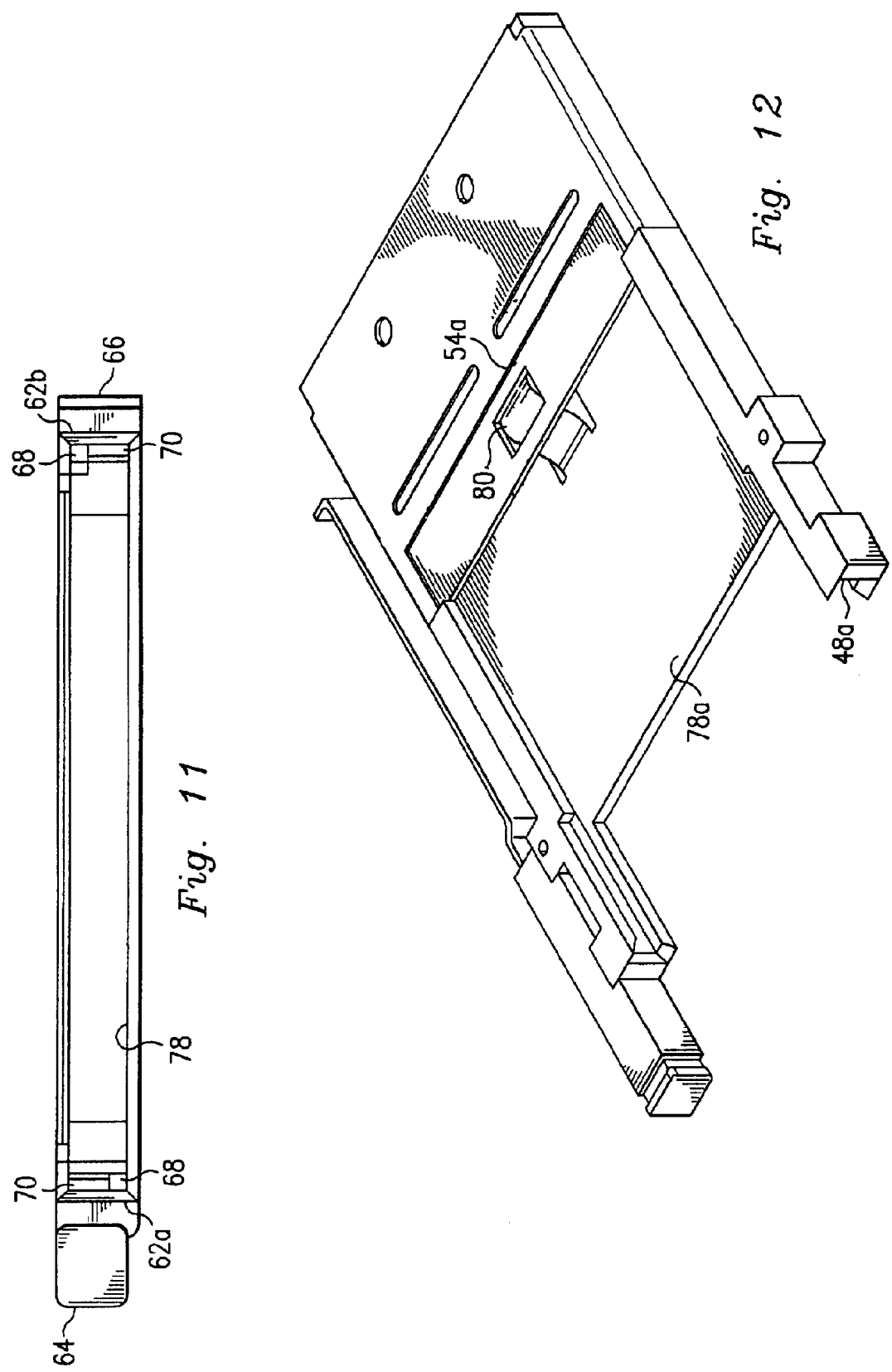

US 6,762,933 B2

METHOD AND APPARATUS FOR SELECTIVE CARD INSERTION

BACKGROUND

The disclosures herein relate generally to computer systems and more particularly to card slots formed in computer chassis.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Computer chassis are provided with card slots. A smart card slot and a card bus slot are now part of a standard computer configuration. The slots are sometimes stacked side-by-side in the computer chassis and are sometimes provided on opposite sides of the chassis. When the slots are side-by-side and not populated, a user may accidentally insert a smart card into the card bus slot. This could cause damage to the card bus connector.

Therefore, what is needed is a cost-efficient means of guarding against a smart card being inserted into the card bus slot and damaging the card bus connector.

SUMMARY

One embodiment, accordingly, provides a guard/stop feature which will allow only a card bus, i.e. a PC card to be inserted into the slot. To this end, a selective card insertion apparatus includes a carrier having a card slot formed therein. The card slot is separated from the second card slot. The first card slot includes a first end and a second end. A connector is provided at the second end. A stop is positioned between the first end and the connector for permitting insertion of a first card and for stopping insertion of a second card.

A principal advantage of this embodiment is if a smart card is accidentally inserted into the card bus slot, the guard/stop feature will stop full insertion and protect against damage to the card bus connector.

BRIEF DESCRIPTION OF THE DRAWINGS

FIG. 11 is an end view taken along the line 11—11 of FIG. 9.

FIG. 12 is a perspective view illustrating an alternate embodiment of a stop.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
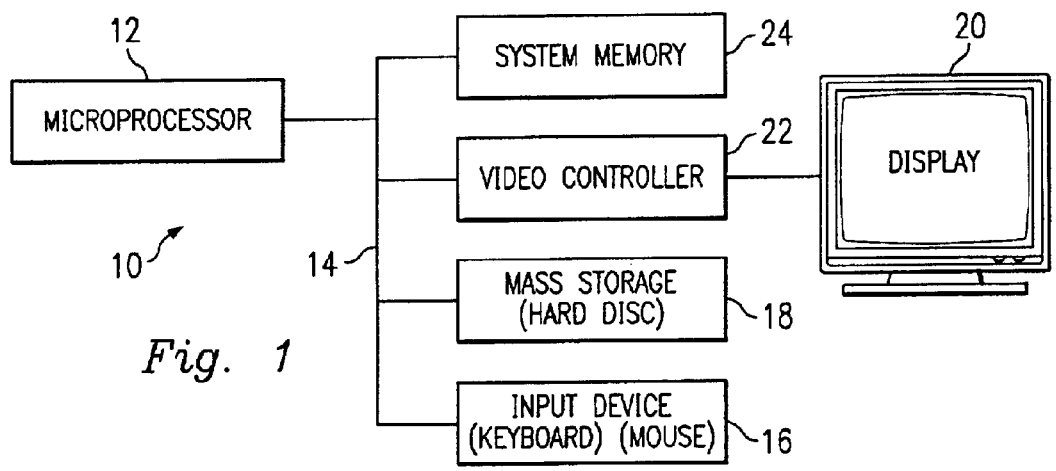
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
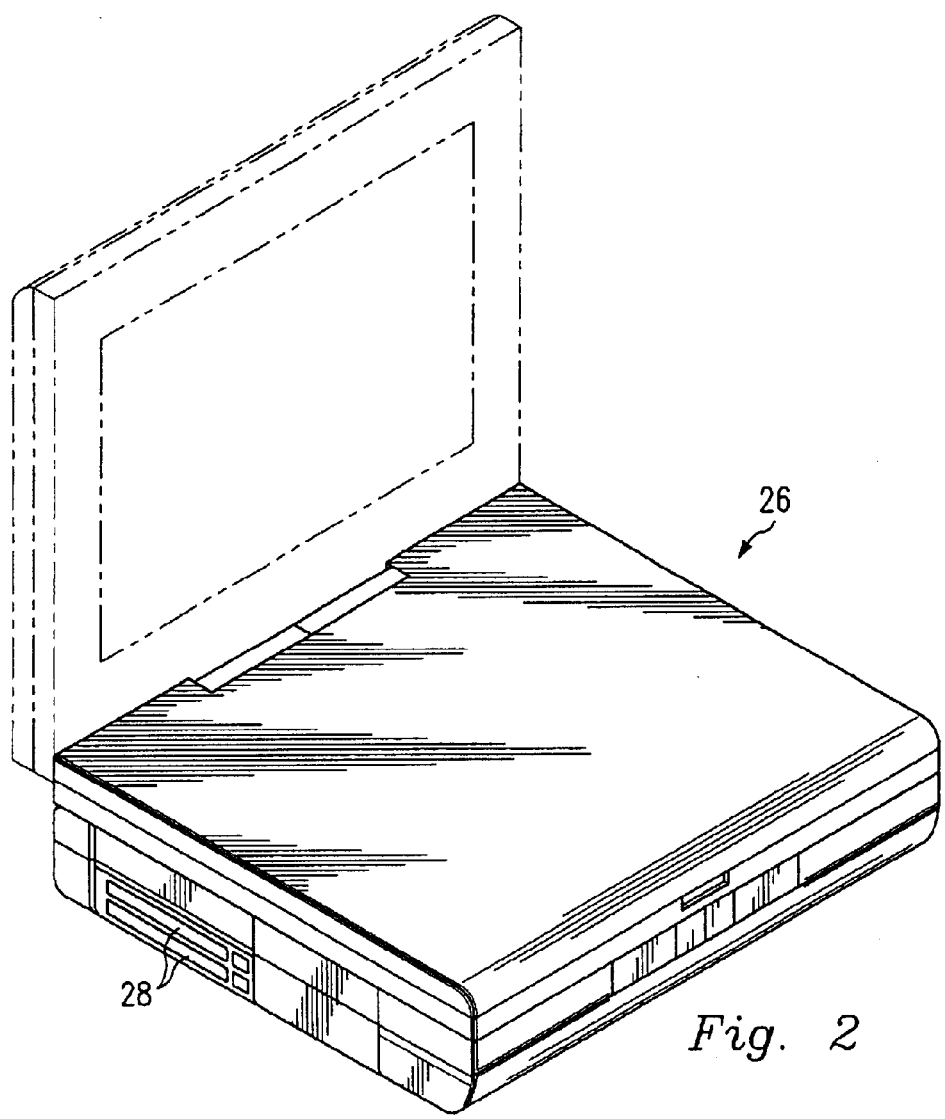
FIG. 2 is a view illustrating an embodiment of a portion of a computer chassis.
Figure 3:
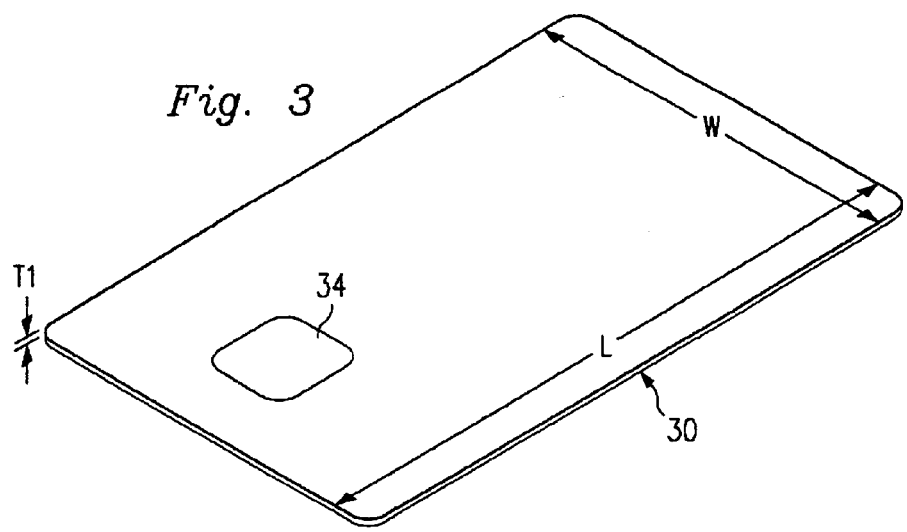
FIG. 3 is a perspective view illustrating an embodiment of a smart card.
Figure 4:
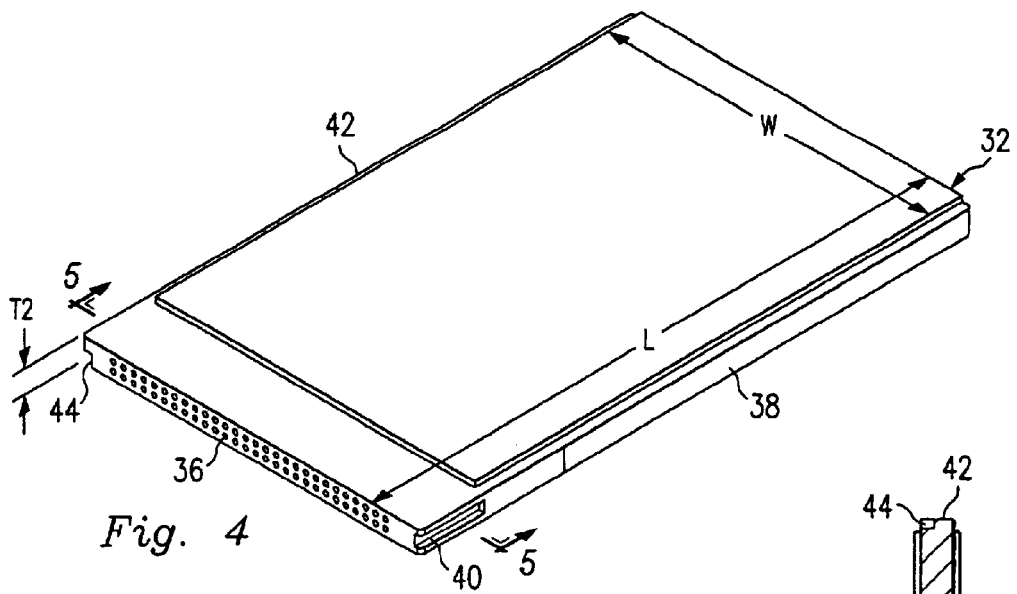
FIG. 4 is a perspective view illustrating an embodiment of a PCMCIA card.
Figure 5:
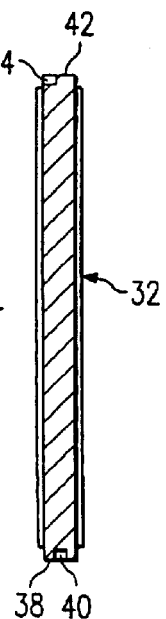
FIG. 5 is a cross-sectional view taken along the line 5—5 of FIG. 4.

In a computer chassis 26, FIG. 2, which may contain the computer system 10 as described above, a card slot or slots 28 are provided for the insertion of various cards such as, for example, a smart card 30 and a card bus, i.e., a PCMCIA card 32, see FIGS. 3, 4 and 5. The smart card 30 is of a thickness T1 and the PCMCIA card is of a second thickness T2 which is greater than T1. Because the cards 30 and 32 are of substantially the same length l and width w, the PCMCIA card 32 is therefore of a greater volume than the smart card 30 due to the greater thickness.

As illustrated in FIG. 3, the smart card 30 includes a reader circuit 34. The PCMCIA card 32 includes a plurality of pin apertures 36. Card 32 also includes a first keyed side 38 having a slot 40 formed therein and a second keyed side 42 having a slot 44 formed therein and offset from slot 40.

Figure 6:
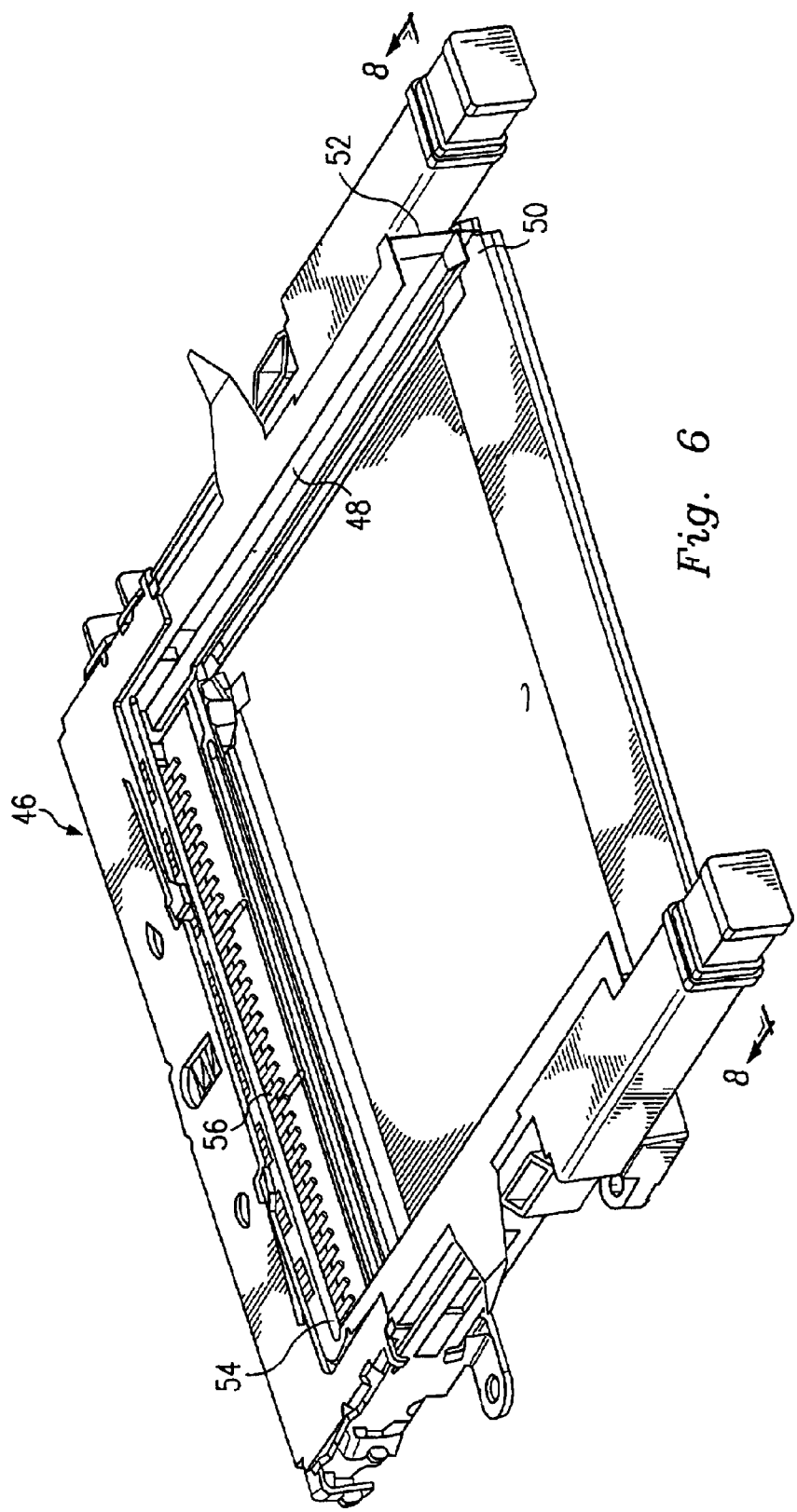
FIG. 6 is a perspective view illustrating an embodiment of a card carrier.
Figure 7:
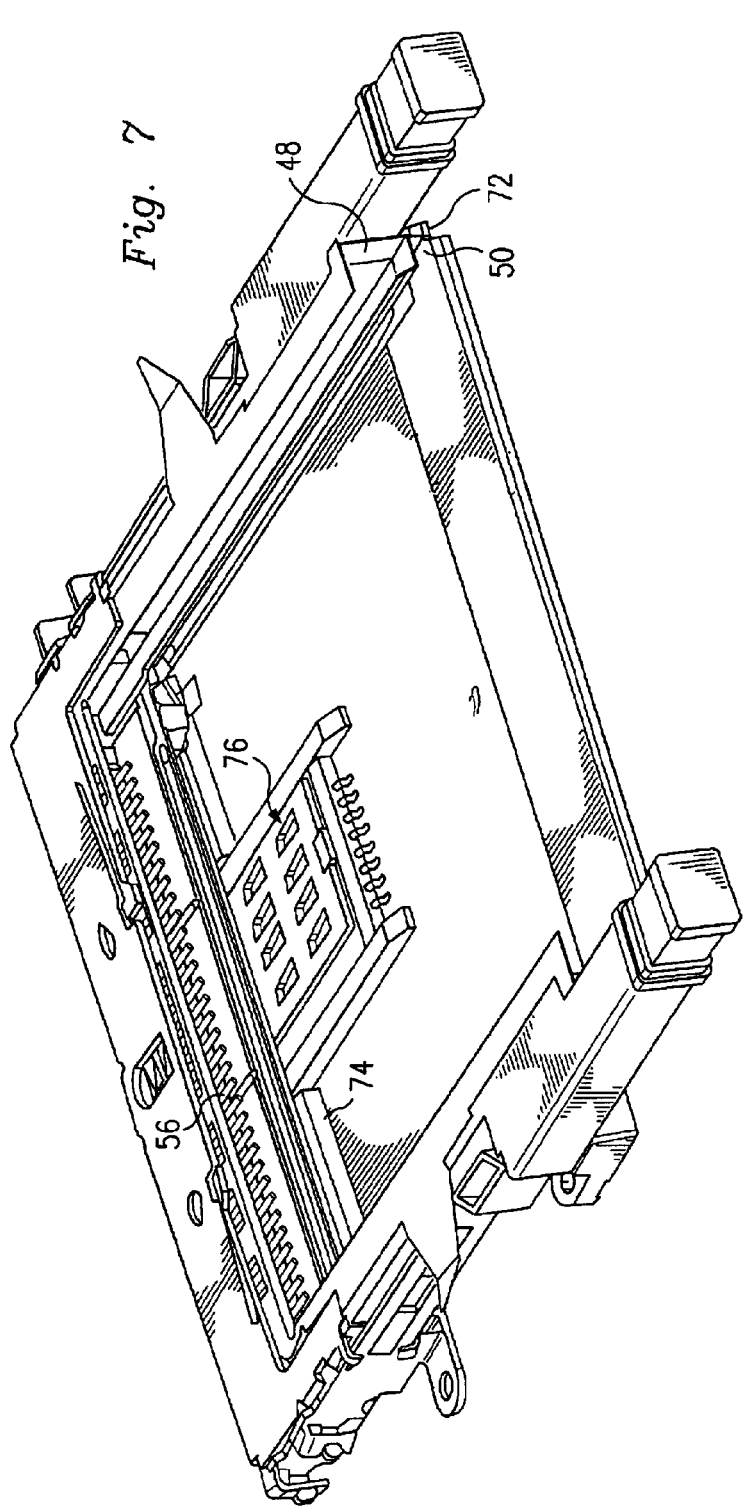
FIG. 7 is a perspective view illustrating an inverse view of the card carrier of FIG. 6.
Figure 8:
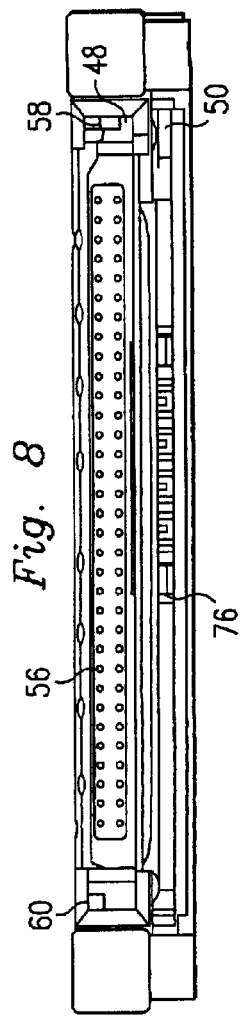
FIG. 8 is an end view taken along the line 8—8 of FIG. 6.

A carrier 46, it is understood, may include a single slot or a plurality of slots 48 and 50, see FIGS. 6, 7 and 8. The slots 48 and 50 are provided to receive cards such as, for example, smart card 30 and PCMCIA card 32. Carrier 46 is mounted in chassis 26, FIG. 2. Slot 48 is of a size sufficient to receive either the smart card 30 or the PCMCIA card 32, and herein is a problem, because only the PCMCIA card is to be inserted in slot 48. Slot 50, on the other hand, is of a size sufficient to receive only the smart card 30. This is because the slot 48 is of a thickness corresponding to T2 and slot 50 is of a thickness corresponding to T1 as described above.

Slot 48 includes a first end 52 and a second end 54. A pin connector 56 is provided at second end 54 for connection with pin apertures 36, FIG. 4. Also slot 48, FIGS. 6, 7, 8, is keyed at 58, 60 to receive the keyed slots 40 and 44, respectively. The keyed connections of 58, 60 and 40, 44, respectively enhance the alignment between pin connector 56 and pin apertures 36.

Slot 50 includes a first end 72 and a second end 74, FIG. 7. A smart card reader 76 is positioned adjacent second end 74 for engagement with reader circuit, FIG. 3.

Figure 9:
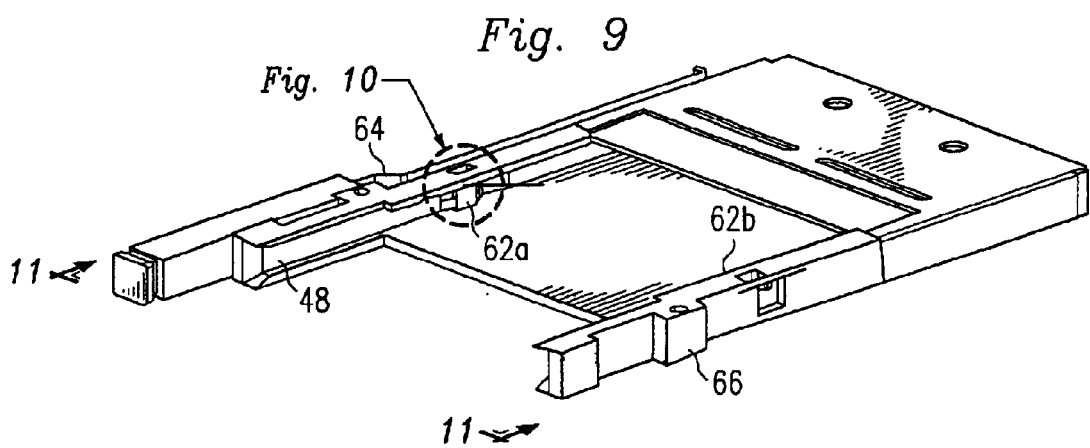
FIG. 9 is a perspective view illustrating an embodiment of a card carrier.
Figure 10:
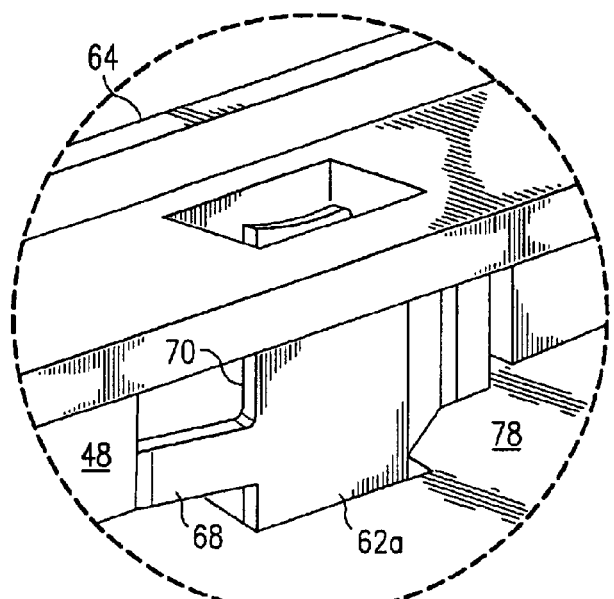
FIG. 10 is an enlarged partial view illustrating an embodiment of a stop.

A pair of resilient stops 62a, 62b are provided on opposite sides 64, 66, respectively, of carrier slot 48, FIGS. 9, 10 and 11. Stops 62a, 62b each include a ramp portion 68 and a stop portion 70. Stops 62a, 62b are in the form of a leaf spring which protrudes into slot 48 but may be flexed outwardly from slot 48.

In the event that smart card 30 is inadvertently inserted into slot 48, the stops 62a, 62b will limit travel of smart card in slot 48. Note that in FIG. 10, the ramp portion 68 of stop 62a is adjacent a surface 78 of slot 48 whereas the stop portion 70 is spaced apart from surface 78. However, the opposed stop 62b, FIG. 11, is inversely positioned to stop 62a so that the stop portion 70 of stop 62b is adjacent surface 78 and the ramp portion 68 is spaced apart from surface 78. In this manner, the stop portions 70 of each stop 62a, 62b are not aligned and thus further enhance limiting inadvertent insertion of smart card 30 in PCMCIA slot 48.

The stops 62a and 62b do not limit insertion of the PCMCIA card 32 because the keyed slots 40, 44, described above, are offset, and therefore, the ramp portion 68 of each stop 62a, 62b will be engaged by a portion of each keyed side 38, 40 of PCMCIA card 32 during insertion.

In an alternate embodiment, FIG. 12, illustrates a single stop 80 positioned adjacent second end 54a of PCMCIA slot 48a. Stop 80 is in the form of a leaf spring extending out of a surface 78a and is easily flexed out of slot 48 when engaged by the substantially rigid PCMCIA card 32. However, the more flexible smart card 30 is easily stopped by the stop 80 so that insertion into slot 48a is limited.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. An information handling system comprising:
    a chassis;
    a microprocessor mounted in the chassis;
    an input coupled to provide input to the microprocessor;
    a storage coupled to the microprocessor;
    a video controller coupled to the microprocessor;
    a memory coupled to the microprocessor;
    a carrier in the chassis having a first card slot and a second card slot formed therein, the first card slot being separated from the second card slot;
    the first card slot having a first end and a second end, the second end including a connector;
    a stop positioned in the first card slot between the first end and the connector for permitting insertion of a first card and for stopping insertion of a second card; and
    wherein the first card is of a first thickness and the second card is of a second thickness, less than the first thickness.

2. The system as defined in claim 1 wherein the first card is of a first volume and the second card is of a second volume, less than the first volume.

3. The system as defined in claim 1 wherein the stop further comprises:
    a first resilient stop member on a first side of the carrier; and
    a second resilient stop member on a second side of the carrier.

4. The system as defined in claim 1 wherein the stop further comprises:
    a resilient stop member adjacent the connector.

5. The system as defined in claim 1 wherein the first card slot is sized to permit the first and second cards to be inserted therein.

6. The system as defined in claim 1 wherein the second card slot is sized to permit only the second card to be inserted therein.

7. The system as defined in claim 1 wherein the first card slot is sized to permit the first and second cards to be inserted therein and the second card slot is sized to permit only the second card to be inserted therein.

8. The system as defined in claim 1 wherein the stop includes a ramp portion and an exposed stop portion.

9. An apparatus for selective card insertion comprising:
    a carrier having a first card slot and a second card slot formed therein, the first card slot being separated from the second card slot;
    the first card slot having a first end and a second end, the second end including a connector;
    a stop positioned in the first card slot between the first end and the connector for permitting insertion of a first card and for stopping insertion of a second card; and
    wherein the first card is of a first thickness and the second card is of a second thickness, less than the first thickness.

10. The apparatus as defined in claim 9 wherein the first card is of a first volume and the second card is of a second volume, less than the first volume.

11. The apparatus as defined in claim 9 wherein the stop further comprises:

a first resilient stop member on a first side of the carrier; and a second resilient stop on a second side of the carrier.

12. The apparatus as defined in claim 9 wherein the stop further comprises:

a resilient stop member adjacent the connector.

13. The apparatus as defined in claim 9 wherein the first card slot is sized to permit the first and second cards to be inserted therein.

14. The apparatus as defined in claim 9 wherein the second card slot is sized to permit only the second card to be inserted therein.

15. The apparatus as defined in claim 9 wherein the first card slot is sized to permit the first and second cards to be inserted therein and the second card slot is sized to permit only the second card to be inserted therein.

16. The apparatus as defined in claim 9 wherein the stop includes a ramp portion and an exposed stop portion.

17. A method for permitting selective card insertion comprising:

providing a carrier having a first card slot separated from a second card slot;

forming an insertion end and a connection end in the first card slot;

positioning a stop in the first card slot between the insertion end and the connection end, whereby the stop permits insertion of a first card and stops insertion of a second card;

providing a first resilient stop member on a first side of the carrier; and providing a second resilient stop member on a second side of the carrier.

18. The method as defined in claim 17 further comprising:

providing a resilient stop member adjacent the connector.

19. The method as defined in claim 17 further comprising:

providing a ramp portion and an exposed stop portion on each stop member.

20. An information handling system comprising:

a chassis;

a microprocessor mounted in the chassis;

an input coupled to provide input to the microprocessor;

a storage coupled to the microprocessor;

a video controller coupled to the microprocessor;

a memory coupled to the microprocessor;

a carrier in the chassis having a card slot formed therein;

the card slot having a first end and a second end, the second end including a connector;

a stop positioned in the card slot between the first end and the connector for permitting insertion of a first card and for stopping insertion of a second card;

a first resilient stop member on a first side of the carrier; and a second resilient stop member on a second side of the carrier opposite the first side.

21. The system as defined in claim 20 wherein the stop members each include a ramp portion and a stop portion.

22. The system as defined in claim 21 wherein the ramp and stop portion of the first stop member is in a first position and the ramp and stop portion of the second stop member is in a second position, inverse to the first position.

23. An apparatus for selective card insertion comprising:

a carrier having a card slot formed therein;

the card slot having a first end and a second end, the second end including a connector;

a stop positioned in the card slot between the first end and the connector for permitting insertion of a first card and for stopping insertion of a second card; and wherein the first card is of a thickness and the second card is of a second thickness, less than the first thickness.

24. An information handling system comprising:

a chassis;

a microprocessor mounted in the chassis;

a storage coupled to the microprocessor;

a carrier in the chassis having a first card slot and a second card slot formed therein, the first card slot being separated from the second card slot;

the first card slot having a first end and a second end, the second end including a connector;

a stop positioned in the first card slot between the first end and the connector for permitting insertion of a first card and for stopping insertion of a second card; and wherein the first card is of a first thickness and the second card is of a second thickness, less than the first thickness.

25. An information handling system comprising:

a chassis;

a microprocessor mounted in the chassis;

a storage coupled to the microprocessor;

a carrier in the chassis having a card slot formed therein;

the card slot having a first end and a second end, the second end including a connector;

a stop positioned in the card slot between the first end and the connector for permitting insertion of a first card and for stopping insertion of a second card;

a first resilient stop member on a first side of the carrier; and a second resilient stop member on a second side of the carrier opposite the first side.

* * * * *